(12) United States Patent
Okada

(10) Patent No.: US 6,309,958 B1
(45) Date of Patent: Oct. 30, 2001

(54) SEMICONDUCTOR DEVICE AND METHOD OF MANUFACTURING THE SAME

(75) Inventor: Norio Okada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/392,215

(22) Filed: Sep. 8, 1999

(30) Foreign Application Priority Data

Sep. 8, 1998 (JP) .................................................. 10-254298

(51) Int. Cl.$^7$ ................................................ H01L 21/4763
(52) U.S. Cl. ........................ 438/624; 438/688; 438/424; 438/222
(58) Field of Search ..................................... 438/624, 623, 438/622, 687, 688, 221, 424, 710, 631, 672, 738, 754

(56) References Cited

U.S. PATENT DOCUMENTS 6,090,701 * 7/2000 Hasunuma et al. .................. 438/632

FOREIGN PATENT DOCUMENTS

| | | |
|---|---|---|
| 7-114236 | 12/1995 | (JP) . |
| 9-164467 | 6/1997 | (JP) . |
| 10-150103 | 6/1998 | (JP) . |
| 10-189723 | 7/1998 | (JP) . |

OTHER PUBLICATIONS

Gao, "Quantitative Characterization Of Sputter–Process Induced Nano Voids and Porous Film State in Magnetic Thin Films", 1997 IEEE, pp. FC–02, Apr. 1997.*

* cited by examiner

Primary Examiner—Charles Bowers
Assistant Examiner—Yennhu B. Huynh
(74) Attorney, Agent, or Firm—Hutchins, Wheeler & Dittmar

(57) ABSTRACT

In a semiconductor device, adjacent ones of aluminum wirings are electrically isolated from each other through an interlayer insulation film containing a void space portion which is disposed between the adjacent ones of the aluminum wirings in a condition in which the void space portion makes its lower surface substantially flush with a lower surface of each of the aluminum wirings. A trench is formed between the adjacent ones of the aluminum wirings in an upper surface of a semiconductor substrate. Each of the trench and the aluminum wirings has its side surfaces covered with a damage preventing silicon oxide film, i.e., side-wall insulation film which is used to form the trench. The trench is filled with the interlayer insulation film.

15 Claims, 7 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and method of manufacturing the same, and more particularly to a semiconductor device and method of manufacturing the same, wherein an insulation film provided with a void space portion is interposed between adjacent ones of a plurality of wirings which are formed on a semiconductor substrate so as to be side by side but not touching.

2. Description of the Related Art

A so-called LSI (i.e., Large Scale Integrated circuit) such as memories, microprocessors and the like known as most typical semiconductor devices makes its individual components minute in size more and more as the integration density of the LSI increases. Under such circumstances, a plurality of wirings formed side by side on a semiconductor substrate are spaced apart from each other at predetermined intervals on the order of submicrons less than or equal to 1 μm. Adjacent ones of the wirings are isolated from each other through an interlayer insulation film.

However, when the wirings are disposed adjacent to each other through such minute intervals, it is inevitable that an inter-wiring capacitance (hereinafter referred to simply as the capacitance) between these adjacent ones of the wirings increases, which often results in cross talk. As for the magnitude of the capacitance, it depends on the dielectric constant of the material of the interlayer insulation film disposed between the adjacent ones of the wirings. As for a silicon oxide film which is most widely used as the interlayer insulation film, its dielectric constant is within a range of from 3.2 to 3.8. On the other hand, as for the void space portion itself, its dielectric constant is substantially 1.0. In this connection, although it is preferable to form the interlayer insulation film disposed between the wirings from material which is as small as possible in its dielectric constant, it is impossible to use the void space portion itself as the interlayer insulation film, because it is substantially impossible for the void space portion itself to prevent the wirings from being exposed to the external atmosphere.

Under such circumstances, for example, Japanese Laid-open Patent Application No. Hei7-114236 discloses one of conventional semiconductor devices, in which a silicon oxide film containing a plurality of void space portions 53 is used as an interlayer insulation film 54. FIG. 5 is a sectional view of the semiconductor device of the above Japanese Patent Publication. As shown in FIG. 5, a plurality of wirings 52 are formed side by side on a semiconductor substrate 51. Disposed adjacent ones of these wirings 52 is the interlayer insulation film 54 formed of the silicon oxide film containing the void space portions 53. Through this interlayer insulation film 54, the adjacent ones of the wirings 52 are electrically isolated from each other.

The interlayer insulation film 54 containing these void space portions 53 is easily formed through an appropriate film-forming process such as a so-called high density plasma enhanced CVD process and like processes. In this case, the void space portion 53 is not maintained under vacuum, but contains a small amount of gases produced when the interlayer insulation film 54 is formed. However, it is possible for the void space portion 53 to have its dielectric constant be substantially equal to that of a space maintained under vacuum.

Consequently, in the above conventional semiconductor device, since the void space portion 53 which is small in dielectric constant is interposed between the adjacent ones of the wirings 52, it is possible for the above conventional semiconductor device to prevent the inter-wiring capacitance from increasing.

On the other hand, in the structure of the conventional semiconductor device shown in FIG. 5, in order to decrease the inter-wiring capacitance thereof, it is necessary to have a lower surface 53a of the void space portion 53 made substantially flush with a lower surface 52a of the wiring 52. However, since the void space portion 53 is formed as the interlayer insulation film 54 is formed, the actual lower surface 53a of the void space portion 53 is formed in a position higher than the lower surface 52a of the wiring 52.

Consequently, in order to make the lower surface 53a of the void space portion 53 substantially flush with that 52a of the wiring 52, as shown in FIG. 6, the inventor of the subject application has already proposed another conventional semiconductor device in Japanese Laid-open Patent Application No. Hei9-164467. In this another conventional semiconductor device, even when the void space portion 53 is formed as the interlayer insulation film 54 is formed, it is possible to make the lower surface 53a of the void space portion 53 substantially flush with that 52a of the wiring 52, as shown in FIG. 6, because formation of the interlayer insulation film 54 starts from a bottom surface of a trench 55 of the semiconductor substrate 51.

A method for fabricating the above another conventional semiconductor device will be now described with reference to FIGS. 7A, 7B and 7C.

As a first step, as shown in FIG. 7A, a metallic wiring film 52A made of aluminum having a film thickness of approximately 800 nm is formed on the semiconductor substrate 51 through a sputtering process and like processes. After that, the thus formed wiring film 54A has only its area being formed into wirings covered with a resist film 56. Then, as shown in FIG. 7B, the metallic wiring film 52 is plasma-etched by using the resist film 56 as a mask, so that the wirings 52 are formed into desired patterns.

Finally, as shown in FIG. 7C, after the resist film 56 is removed, a so-called etch back is conducted through a plasma etching process to form a plurality of trenches 55 each of which has a depth of approximately 200 nm. Incidentally, the plasma etching process is preferable since it is an excellent means in etching the metallic wiring films or semiconductor materials. After that, the high density plasma enhanced CVD process and like processes are used to form the interlayer insulation film containing the void space portions, so that the above another conventional semiconductor device shown in FIG. 6 is fabricated.

However, even the another conventional semiconductor device shown in FIG. 6 suffers from the disadvantage of having the wirings damaged by the electric charge produced from plasma which is used in forming the trenches on the surface of the semiconductor substrate through the plasma etching process.

The above disadvantage will be now described with reference to FIG. 8. Even after the wirings 52 are formed through the plasma etching process of the metallic wiring film 52A, the etching process continues to form the trenches 55. At this time, since the wirings 52 have their side surfaces exposed to the external atmosphere, the electric charge such as excessive electrons and the like resulted from the plasma tends to enter electric conductor elements 57a, 57b. Here, in the conductor element 57b and the like electrically connected with the semiconductor substrate 51, there is no problem since the electric charge or excessive electrons may escape to the ground.

On the other hand, as for the other conductor element 57a which is electrically connected with an insulated-gate electrode 58 of an MOS (i.e., Metal Oxide Semiconductor) type transistor comprising a source region 60 and a drain region 61, the electrons which enter the conductor element 57a are accumulated in the insulated-gate electrode 58. As a result, a potential difference is developed between the insulated-gate electrode 58 and the semiconductor substrate 51. Due to the presence of the thus developed potential difference, the gate insulation film 59 is destroyed.

SUMMARY OF THE INVENTION

In view of the above, it is an object of the present invention to provide a semiconductor device and method of manufacturing the same, wherein it is possible to prevent its wirings from being damaged by the electric charge produced by plasma, when the semiconductor device is produced by using a plasma etching process.

According to a first aspect of the present invention, there is provided a semiconductor device: having a construction in which: a plurality of wirings are formed side by side on a semiconductor substrate; adjacent ones of the wirings are spaced apart from each other through a trench, the trench having its bottom surface formed at a lower level than that of a lower surface of each of the wirings through a plasma etching process; the trench is filled with an insulation film containing a void space portion; and, the void space portion of the insulation film has its lower surface made substantially flush with a lower surface of each of the wirings, the improvements wherein:

at least one of side surfaces of each of the wirings is covered with a side-wall insulation film for preventing dielectric breakdown of the semiconductor device during the plasma etching process.

In the foregoing, it is preferable that a mask insulation film is formed on the wirings to protect the wirings.

Also, preferably, the wirings are formed of a metal film made of aluminum-base alloys or copper-base alloys.

Also, a preferable mode is one wherein the mask insulation film is formed of a silicon oxide film or a silicon nitride film when the wirings are formed of a metal film made of aluminum-base alloys. The mask insulation film is preferably formed of a silicon nitride film when the wirings are formed of a metal film made of copper-base alloys.

Further, preferably, a silicon oxide film or a silicon nitride film is used as the side-wall insulation film when the wirings are formed of a metal film made of aluminum-base alloys. Preferably, a silicon nitride film is used as the side-wall insulation film when the wirings are formed of a metal film made of copper-base alloys.

Still further, a preferable mode is one wherein each of the wirings has a stacked structure comprising a lower layer and an upper layer, wherein the lower layer is constructed of a high-melting metal film or a stacked film constructed of the high-melting metal film and a nitride film, and the upper layer is constructed of a metal film made of aluminum-base alloys or copper-base alloys.

A preferable mode is one wherein each of the wirings has a stacked structure comprising a lower layer, an intermediate layer and an upper layer, wherein: the lower layer is constructed of a high-melting metal film or a stacked film constructed of the high-melting metal film and a nitride film of the high-melting metal film; the intermediate layer is constructed of a metal film made of aluminum or copper; and, the upper layer is constructed of a high-melting metal film or a stacked film constructed of the high-melting metal film and a nitride film of the high-melting metal film.

According to a second aspect of the present invention, there is provided a method of manufacturing a semiconductor device comprising:

a wiring formation step for forming a wiring pattern having a region in which a plurality of wirings are disposed side by side on a semiconductor substrate;

a side-wall insulation film forming step for forming a side-wall insulation film on a side wall of each of the wirings;

a trench formation step for forming a trench which has its bottom surface formed at a positon lower than a lower surface of each of the wirings, the trench being disposed between adjacent ones of the wirings; and a void-containing insulation film formation step for forming an insulation film containing a void space portion therein, wherein the insulation film is formed in the trench in a manner such that the void space portion makes its lower surface substantially flush with a lower surface of each of the wirings.

According to a third aspect of the present invention, there is provided a method of manufacturing a semiconductor device comprising:

a resist-film formation step for forming a resist film which selectively covers a mask insulation film formed on a wiring metal film on a semiconductor substrate;

a wiring formation step for forming a wiring pattern provided with a region in which a plurality of wirings are disposed side by side, the wiring pattern being formed through a plasma etching process of both the mask insulation film and the wiring metal film by using the resist film as a mask;

a side-wall insulation film formation step for forming a side-wall insulation film on a side wall of each of the wirings;

a trench formation step for forming a trench which has its bottom surface formed at a position lower than a lower surface of each of the wirings, the trench being disposed between adjacent ones of the wirings; and a void-containing insulation film formation step for forming an insulation film containing a void space portion therein, wherein the insulation film is formed in a manner such that the void space portion has its lower surface made substantially flush with the lower surface of each of the wirings.

In the above third aspect, a preferable mode is one wherein a metal film made of aluminum-base alloys or of copper-base alloys is used as the wiring metal film in the resist-film formation step.

Further, it is preferable in the resist-film formation step, that a silicon oxide film or a silicon nitride film is used as the mask insulation film when a metal film made of aluminum-base alloys is used as the wiring metal film; and, a silicon nitride film is used as the mask insulation film when a metal film made of copper-base alloys is used as the wiring metal film.

Further, in the side-wall insulation film formation step, a preferable mode is one wherein a silicon oxide film or a silicon nitride film is used as the side-wall insulation film when a metal film made of aluminum-base alloys is used as the wiring metal film; and, a silicon nitride film is used as the side-wall insulation film when a metal film made of copper-base alloys is used as the wiring metal film.

Further, in the resist-film formation step, as the wiring metal film comprising a lower layer and an upper layer, a preferable mode is one wherein there are subsequently formed: the lower layer constructed of a high-melting metal film or a stacked film constructed of both the high-melting metal film and a nitride film of the high-melting metal film; and, the upper layer constructed of a metal film made of aluminum-base alloys or of copper-base alloys.

Still further, in the resist-film formation step, as the wiring metal film comprising a lower layer, an intermediate layer and an upper layer, there are subsequently formed: a lower layer constructed of a high-melting metal film or a stacked film constructed of both the high-melting metal film and a nitride film of the high-melting metal film; the intermediate layer constructed of a metal film made of aluminum-base alloys or of copper-base alloys; and, the upper layer constructed of a high-melting metal film or a stacked film constructed of the high-melting metal film and a nitride film of the high-melting metal film.

Further, it is preferable in the wiring formation step that the semiconductor substrate has its surface slightly over-etched.

With the above procedures and constructions, it is possible to prevent the wirings from being damaged by the electric charge produced by plasma.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

The best modes for carrying out the present invention will be described in detail using embodiments of the present invention with reference to the accompanying drawings.

First Embodiment

Figure 1:
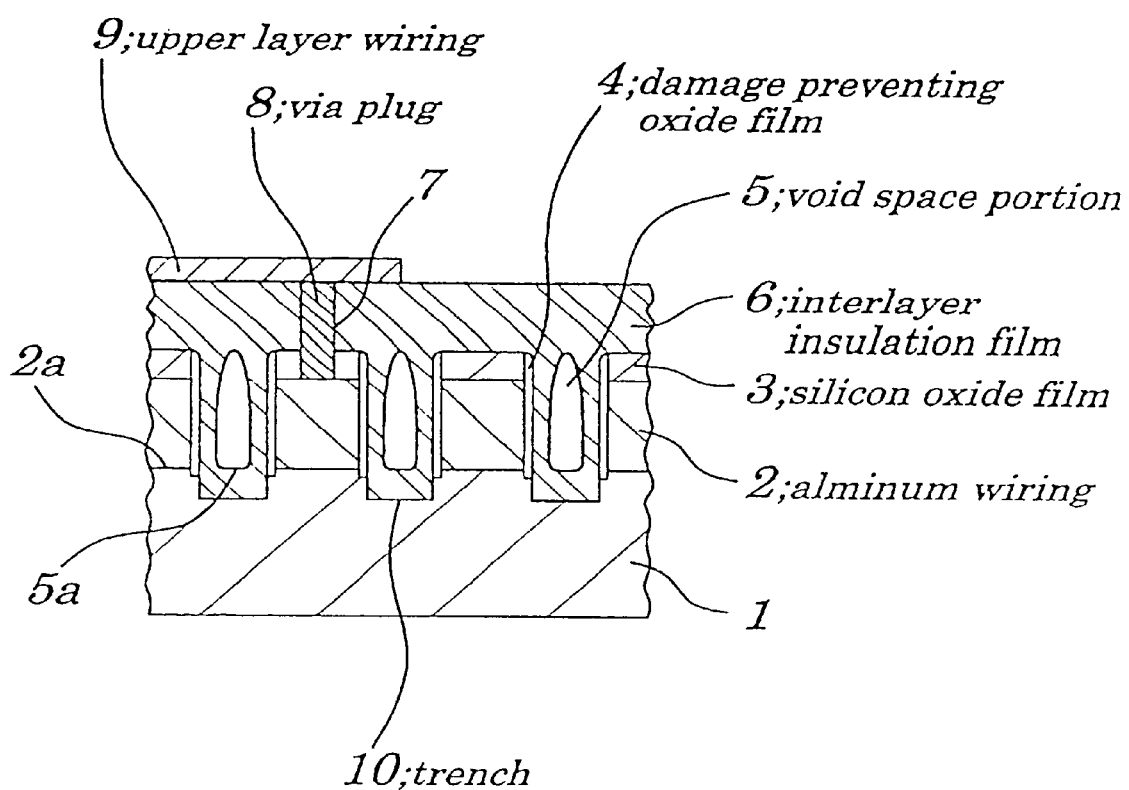
FIG. 1 is a sectional view of the semiconductor device of a first embodiment of the present invention.

FIG. 1 shows a sectional view of a semiconductor device of a first embodiment of the present invention. A method of manufacturing the semiconductor device of the present invention will be described sequentially in the order of its process steps with reference to FIGS. 2A, 2B and 2C, and further to FIGS. 3A and 3B.

As shown in FIG. 1, in the first embodiment of the semiconductor device of the present invention: an aluminum wiring 2 having a film thickness of approximately 800 nm is formed adjacent to an upper surface of a semiconductor substrate 1; and, a silicon oxide film 3 having a film thickness of from 100 to 200 nm is formed on the aluminum wiring 2 to serve as a mask insulation film. This silicon oxide film 3 is used to protect or cover the aluminum wiring 2. Formed between adjacent ones of the aluminum wirings 2 on the upper surface of the semiconductor substrate 1 is a trench 10 having a depth of approximately 200 nm.

Each of the trench 10 and the aluminum wiring 2 has its side surface covered with a damage preventing oxide film 4. The trench 10 is filled with an interlayer insulation film 6. This interlayer insulation film 6 is formed of an oxide film containing a void space portion 5 which is disposed between the adjacent ones of the aluminum wirings 2. In the trench 10, the void space portion 5 of the interlayer insulation film 6 makes its lower surface 5a substantially flush with a lower surface 2a of the aluminum wiring 2.

A through-hole 7 is formed in a predetermined portion of each of the silicon oxide film 3 and the interlayer insulation film 6 formed on the aluminum wiring 2, and filled with a via plug 8 made of tungsten and like materials. Further, formed on the interlayer insulation film 6 is an upper layer wiring 9 which is formed of an aluminum film connected with the via plug 8. If necessary, it is also possible to form the via plug 8 through an appropriate barrier metal film such as titan nitride film and the like.

As described above, the aluminum wiring 2 has its surface covered with the silicon oxide film 3, and also has each of its side surfaces covered with the damage preventing silicon oxide film 4. Consequently, in fabricating the semiconductor device of the present invention, there is no fear that the aluminum wirings 2 are affected by the electric charge produced by plasma which is produced when the aluminum wiring film is subjected to a plasma etching process to pattern the wirings 2. As a result, in the semiconductor device of the present invention, it is possible to prevent the electric charge (i.e., plasma charge) from entering the aluminum wirings 2. Consequently, in the semiconductor device of the present invention, there is no fear that an insulated-gate electrode of an MOS type transistor is broken down.

Figure 2A:
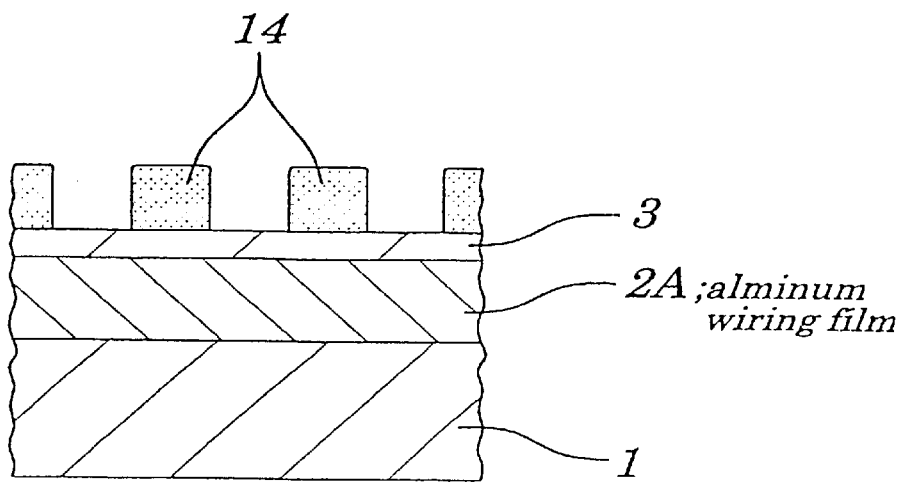
FIGS. 2A, 2B and 2C are sectional views of the semiconductor device of the present invention shown in FIG. 1, illustrating sequentially the process steps of the method of manufacturing the semiconductor device.

Now, with reference to FIGS. 2A, 2B and 2C, and further to FIGS. 3A and 3B, the method of manufacturing the semiconductor device of the present invention will be described sequentially in the order of the process steps of the method. First, as shown in FIG. 2A, an aluminum wiring film 2A having a film thickness of approximately 800 nm is formed on the silicon semiconductor substrate 1 through a sputtering process and like processes. Formed through a plasma enhanced CVD process and like processes after formation of the aluminum wiring film 2A is the silicon oxide film 3 having a film thickness of approximately 300 nm. After formation of the silicon oxide film 3, a resist film 14 is formed through a lithography process in a manner such that the resist film 14 covers only a region in which the wirings of the silicon oxide film 3 are formed.

Figure 2B:
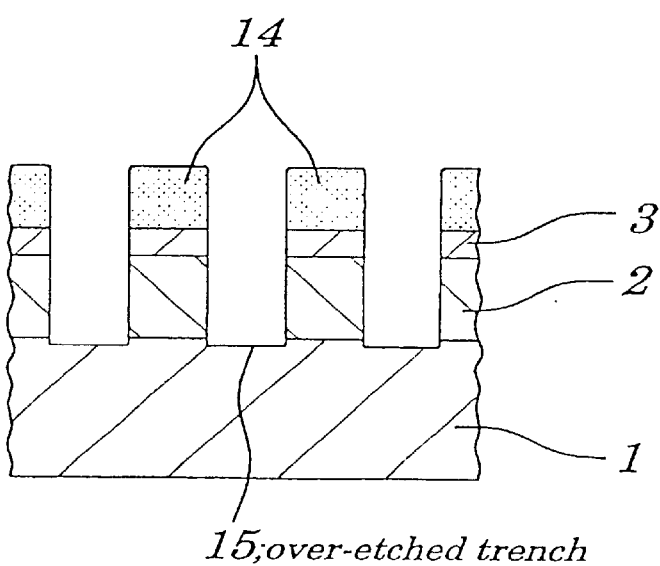

Next, as shown in FIG. 2B, both the silicon oxide film 3 and the aluminum wiring film 2A are etched through a plasma etching process by using the resist film 14 as a mask to pattern the aluminum wiring 2 having a desired pattern. At this time, although the plasma etching process is preferably finished at a time when the aluminum wiring film 2A is separated and formed into the aluminum wirings 2, such finishing is difficult in the actual process. As a result, there is produced an over-etched trench 15 having a depth of several tens nm in the upper surface of the semiconductor substrate 1.

Figure 2C:
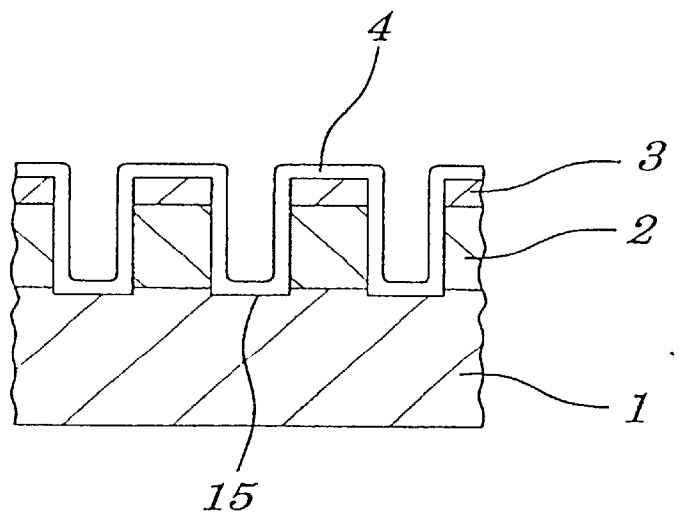

Then, as shown in FIG. 2C, after the resist film 14 is removed, the plasma enhanced CVD process is used to form the damage preventing silicon oxide film 4 having a film thickness of from 50 to 250 nm on each of the side surfaces of each of the silicon oxide film 3, aluminum wirings 2 and on the upper surface of each of the silicon oxide film 3 and the semiconductor substrate 1 to as to cover these surfaces.

Figure 3A:
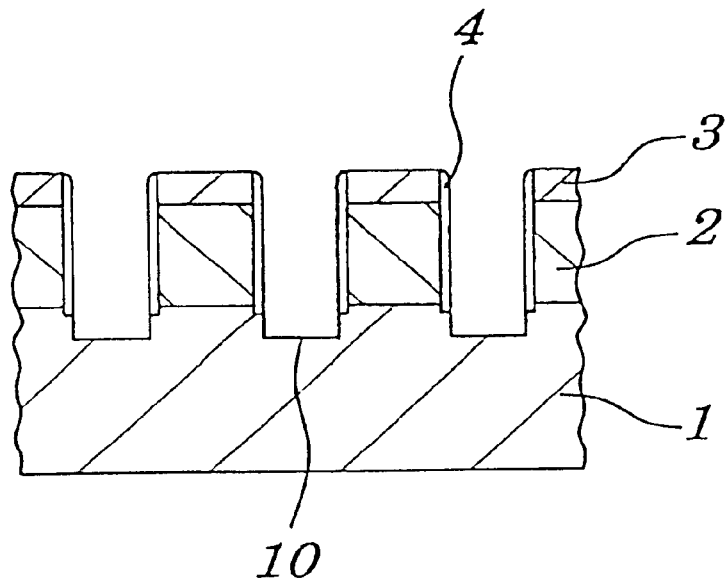
FIGS. 3A and 3B are sectional views of the semiconductor device of the present invention shown in FIG. 1, illustrating sequentially the process steps of the method of manufacturing the semiconductor device.

After that, as shown in FIG. 3A, a so-called etch back is performed using the plasma etching process to etch the damage preventing silicon oxide film 4, so that the trench 10 having a depth of approximately 200 nm is formed between adjacent ones of the aluminum wirings 2 disposed adjacent to the upper surface of the semiconductor substrate 1. In this plasma etching process, the damage preventing silicon oxide film 4 has its entire surface etched. However, there is a difference in etching rate between the vertical portions and the horizontal portions. More particularly, the damage preventing silicon oxide film 4 has its portion adjacent to the upper surface of the silicon oxide film 3 etched at higher rate than that of its another portion adjacent to the vertical side walls of each of the silicon oxide film 3 and the aluminum wirings 2. As a result, after completion of the above plasma etching process, the upper surface of the silicon oxide film 3 is reduced in film thickness and has its upper surface exposed to the external atmosphere. Further, the damage preventing silicon oxide film 4 disposed adjacent to the side walls of each of the aluminum wirings 2 and the mask silicon oxide film 3 is also reduced in film thickness.

Figure 3B:
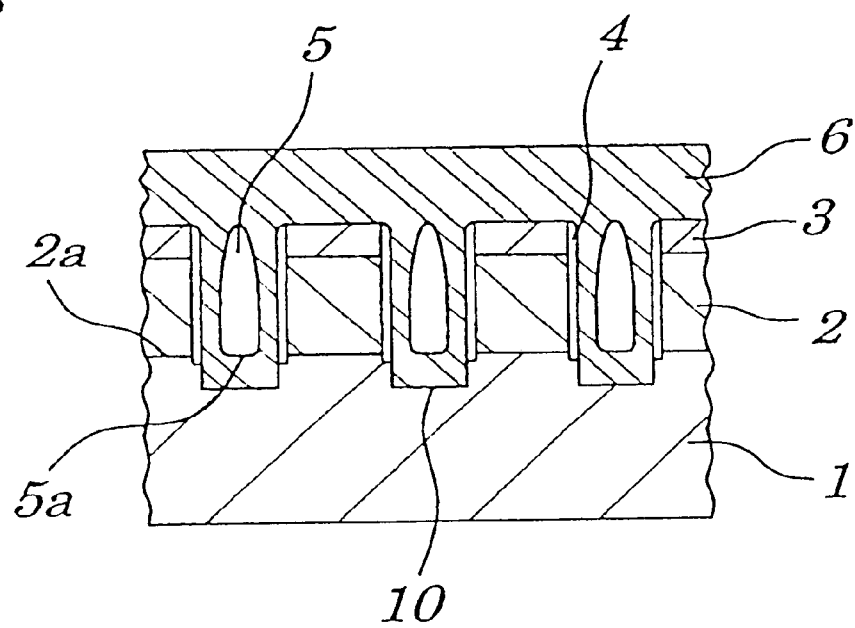

Then, as shown in FIG. 3B, by using the high density plasma enhanced CVD process and like processes, an oxide film containing the void space portion 5 is formed, which oxide film forms the interlayer insulation film 6. Since the trench 10 is previously formed in the upper surface of the semiconductor substrate 1, it is possible to make the lower surface 5a of the void space portion 5 of the interlayer insulation film 6 substantially flush with the lower surface 2a of each of the aluminum wirings 2.

After that, the through-hole 7 is formed in the silicon oxide film 3 and the interlayer insulation film 6 on the aluminum wiring 2. This through-hole 7 is filled with a via plug 8 through the CVD process, wherein the via plug 8 is made of tungsten and like materials. Then, the upper layer wiring 9 formed of the aluminum film and the like is formed on the interlayer insulation film 6 so as to be connected with the via plug 8, whereby the semiconductor device of the first embodiment of the present invention is produced.

As described above, in the construction of the first embodiment of the semiconductor device of the present invention: the aluminum wirings 2 are formed so as to be disposed adjacent to the upper surface of the semiconductor substrate 1; the adjacent ones of the aluminum wirings 2 are electrically isolated from each other through the interlayer insulation film 6 containing the void space portions 5 each of which is disposed between the adjacent ones of the aluminum wirings 2; and, the void space portion 5 makes its lower surface 5a substantially flush with the lower surface 2a of each of the aluminum wirings 2. In the semiconductor device of the present invention having the above construction: the trench 10 is formed between the adjacent ones of the aluminum wirings 2 in the upper surface of the semiconductor substrate 1; the side surfaces of each of the trench 10 and the aluminum wiring 2 are covered with the damage preventing silicon oxide film 4 which is used when the trench 10 is formed; and, the interlayer insulation film 6 is formed so as to fill the trench 10 therewith.

Further, after patterning the aluminum wirings 2, as shown in FIG. 2C, the aluminum wiring 2 has its upper surface covered with the damage preventing silicon oxide film 4 through the silicon oxide film (i.e., mask insulation film) 3, and has its side walls directly covered with the damage preventing silicon oxide film 4. Under such circumstances, the trench 10 is formed through the plasma etching process, so that the semiconductor device of the present invention is produced.

Consequently, when the semiconductor device of the present invention is produced by using the plasma etching process, it is possible for the semiconductor device of this embodiment to prevent its wirings 2 from being damaged by the electric charge produced by plasma.

Second Embodiment

Figure 4:
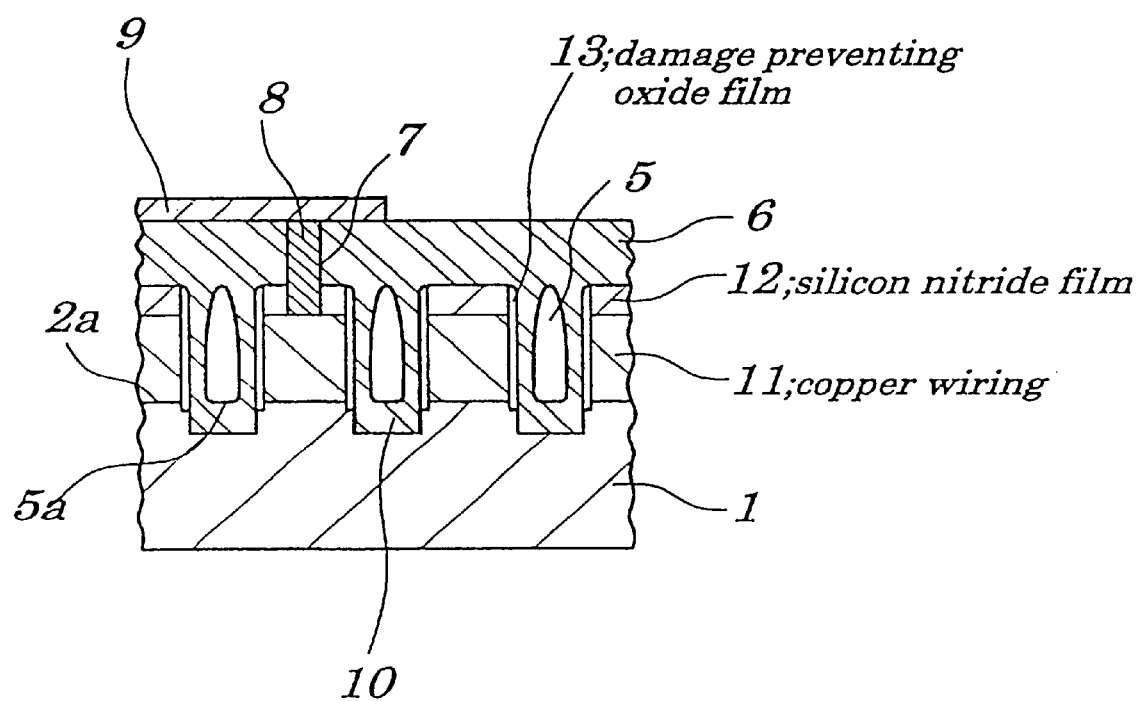
FIG. 4 is a sectional view of the semiconductor device of a second embodiment of the present invention.
Figure 5:
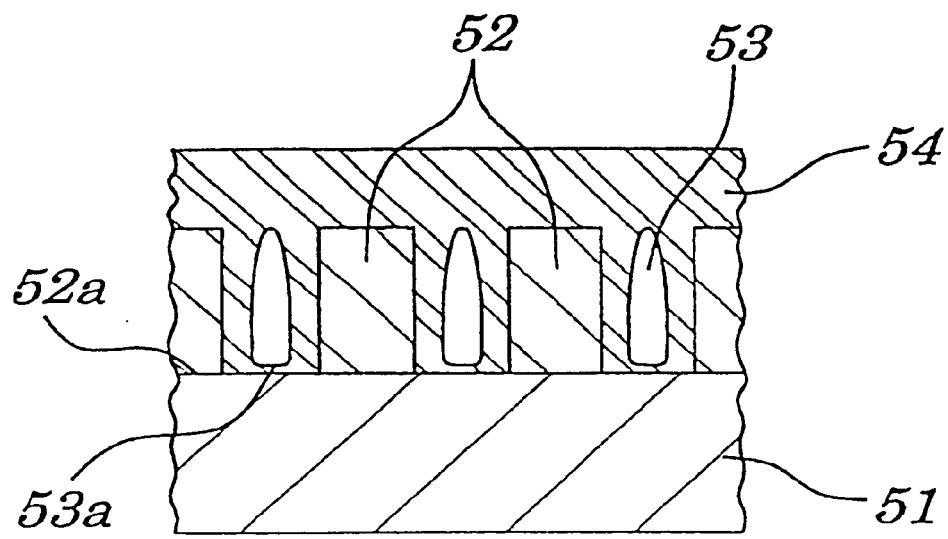
FIG. 5 is a sectional view of a first one of the conventional semiconductor devices.
Figure 6:
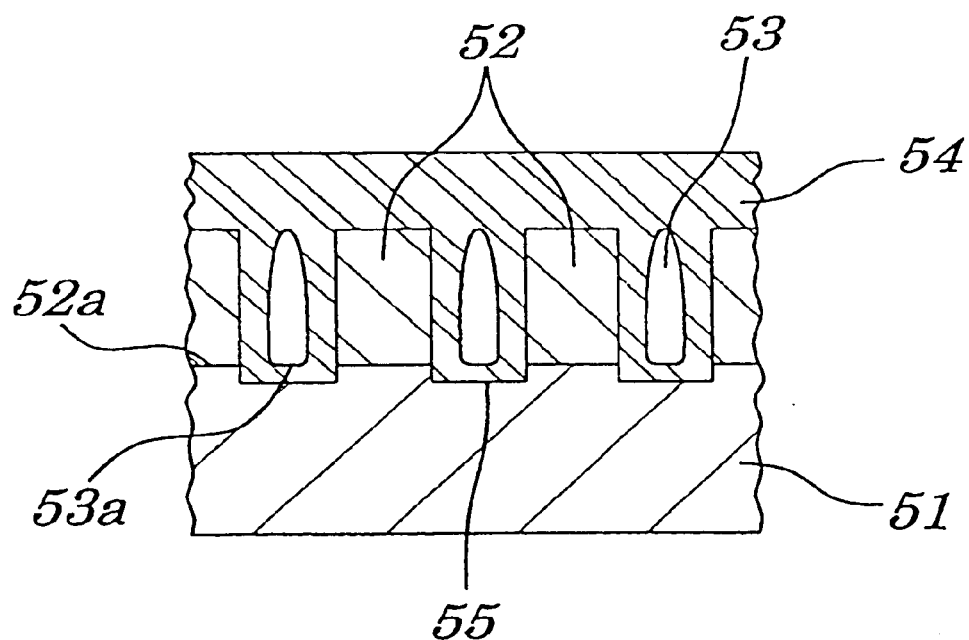
FIG. 6 is a sectional view of a second one of the conventional semiconductor devices.
Figure 7A:
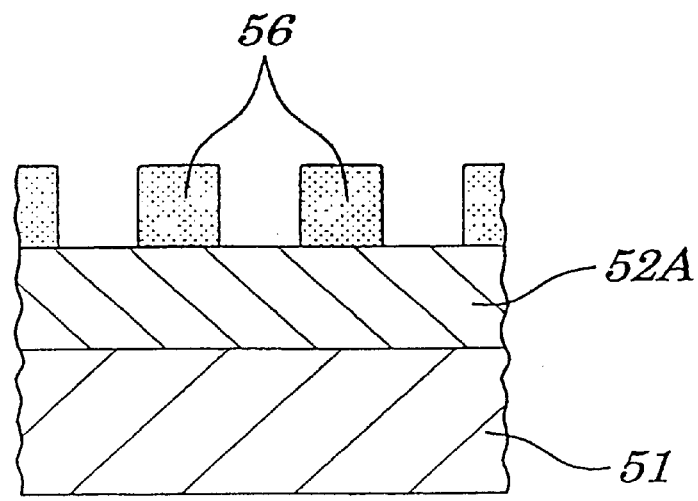
FIGS. 7A, 7B and 7C are sectional views of the conventional semiconductor device, illustrating sequentially the process steps of the method of manufacturing the conventional semiconductor device.
Figure 7B:
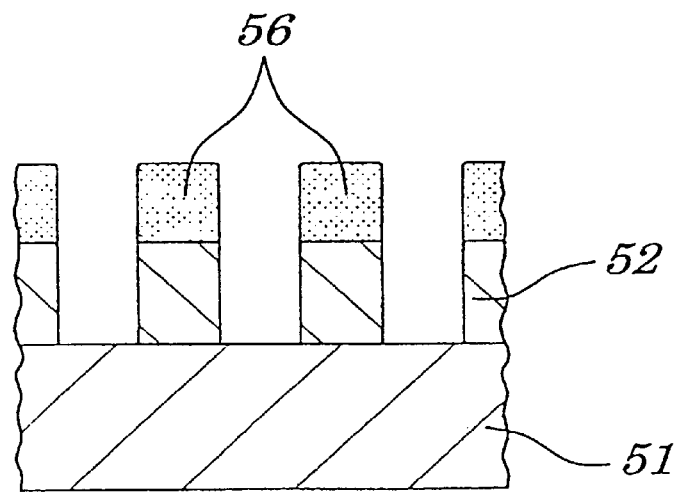
Figure 7C:
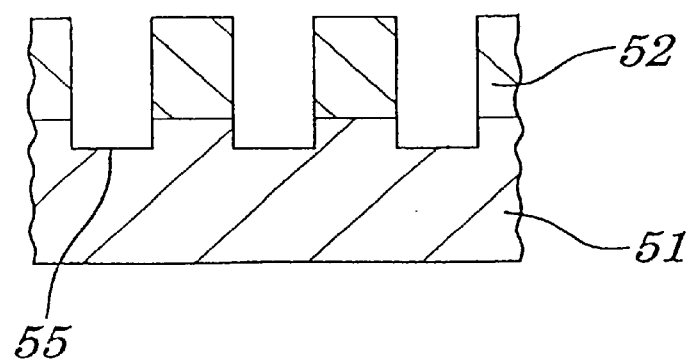
Figure 8:
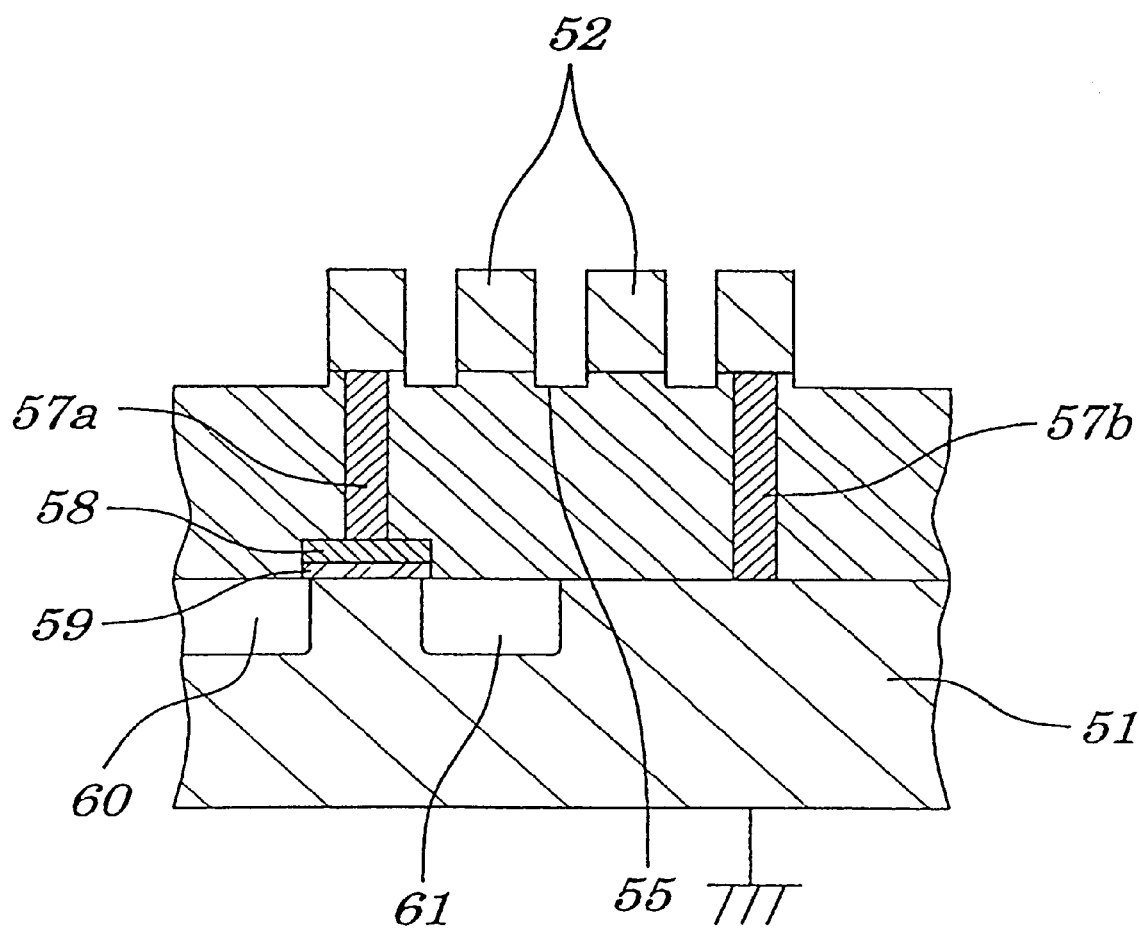
FIG. 8 is a sectional view of the conventional semiconductor device, illustrating the disadvantage of the conventional semiconductor device.

FIG. 4 shows a sectional view of the semiconductor device of a second embodiment of the present invention, wherein the semiconductor device forms a field effect transistor. This second embodiment differs from the first embodiment shown in FIG. 1 in that; the second embodiment uses copper as the material of the wirings; and, a silicon nitride film is used to serve as each of the mask insulation film and the damage preventing insulation film. More specifically, as is clear from comparison with the first embodiment shown in FIG. 1, in the second embodiment, as shown in FIG. 4: a plurality of copper wirings 11 each of which has a film thickness of approximately 400 nm are formed so as to be disposed adjacent to the upper surface of the semiconductor substrate 1; and, a silicon nitride film 12 having a film thickness of approximately 200 nm is formed on the copper wirings 11. Further, each of thee trenches 10 and the copper wirings 11 has its side surfaces covered with the damage preventing silicon nitride film 13 having a film thickness of from 50 to 250 nm. Since the copper wiring 11 is substantially a half of the aluminum wiring 2 in specific resistance, it is possible to reduce the film thickness of the copper wiring 11 and thereby preventing any signal delay. Consequently, it is possible to improve the semiconductor device in operation speed.

In order to produce the semiconductor device of the second embodiment of the present invention, as shown in FIG. 2A, it is necessary to use the copper wiring film in place of the aluminum wiring film 2A, and to use the silicon nitride film in place of the silicon oxide film 3. Similarly, as shown in FIG. 2C, it is necessary to use the damage preventing silicon nitride film in place of the damage preventing silicon oxide film 4, and to perform substantially the same process steps as those performed in the first embodiment of the present invention.

The remaining portion of the second embodiment of the present invention is substantially the same as that of the first embodiment of the prsent invention. Therefore, throughout FIGS. 1 and 4, like reference numerals apply to similar parts.

As described above, the second embodiment of the present invention has substantially the same effect as that of the first embodiment of the present invention.

In addition to the above, in the second embodiment of the present invention having the above construction, since the silicon nitride film excellent in barrier properties with respect to the prevention of copper diffusion into the interlayer insulation film is used as each of the mask insulation film and the damage preventing insulation film, it is possible to prevent copper from diffusing into the environment.

Incidentally, in the first and the second embodiment of the present invention described above, the aluminum wirings and the copper wiring are formed of the aluminum metal film and the copper metal film, respectively, wherein each of these metal films is of a single layer type. In this respect, it is also possible for the present invention to use a stacked structure in which the aluminum metal film or copper metal film is combined with a barrier metal film. In this case, the wiring has a stacked structure comprising a lower layer and an upper layer, wherein: the lower layer is constructed of a high-melting metal film made of titanium, tantalum, tungsten and like metals, or, constructed of a stacked layer which is constructed of the high-melting metal film and a nitride film of the high-melting metal film; and, the upper layer is constructed of the aluminum metal film or the copper metal film. Alternatively, the lower layer may be constructed of the high-melting metal film, or, of the stacked layer comprising both the high-melting metal film and the nitride film of the high-melting metal film; the intermediate layer may be formed on the lower layer, and constructed of the aluminum metal film or the copper metal film; and, the upper layer is constructed of the high-melting metal film, or, of the stacked layer comprising the high-melting metal film and the nitride film of the high-melting metal film.

It is apparent that the present invention is not limited to the above embodiments but may be changed and modified without departing from the scope and spirit of the invention.

For example, it is also possible to form the interlayer insulation film with the void space portions through a conventional CVD process in addition to the high density plasma enhanced CVD process and like processes.

Further, when the aluminum wirings are used, it is also possible to use a silicon nitride film in addition to the silicon oxide film as the mask insulation film and the damage preventing insulation film. Further, when the aluminum wirings are used, the aluminum wirings can be made of aluminum-base alloys in addition to pure aluminum, wherein the alloys may contain other metals such as silicon, copper and the like. Similarly, when the copper wirings are used, the copper wirings can be made of copper-base alloys in addition to pure copper, wherein the copper-base alloys may contain other metals such as titanium, aluminum and like metals. Namely, In the case of the aluminum wirings, it is possible to use a metal film made of aluminum-base alloys. As for the copper wirings, it is possible to use a metal film made of copper-base alloys.

Further, as for the interlayer insulation film, it is possible to use, in addition to the oxide film, a film formed through the plasma CVD process, wherein the film is low in dielectric constant, and may be, for example, SiOF films, amorphous/carbon ($\alpha$-C: F) films and like films. Further, as for the film thickness in the wirings and the mask insulation films, it is only an example in the above description of the present invention, and, therefore may vary in accordance with its applications and purposes.

As is clear from the above, with the above construction of the present invention, it is possible to prevent the wirings from being damaged by the electric charge produced by plasma.

Finally, the present application claims the Convention Priority based on Japanese Patent Application No. Hei10-254298 filed on Sep. 8, 1998, which is herein incorporated by reference.

What is claimed is:

1. A method of manufacturing a semiconductor device, comprising:
   a wiring formation step for forming a wiring pattern having a region in which a plurality of wirings are disposed side by side on a semiconductor substrate;
   a side-wall insulation film forming step for forming a side-wall insulation film on a side wall of each of said wirings;
   a trench formation step for forming a trench which has its bottom surface formed at a positon lower than a lower surface of each of said wirings, said trench being disposed between adjacent ones of said wirings; and
   a void-containing insulation film formation step for forming an insulation film containing a void space portion therein, wherein said insulation film is formed in said trench in a manner such that said void space portion makes its lower surface substantially flush with a lower surface of each of said wirings.

2. A method of manufacturing a semiconductor device, comprising:
   a resist-film formation step for forming a resist film which selectively covers a mask insulation film formed on a wiring metal film on a semiconductor substrate;
   a wiring formation step for forming a wiring pattern provided with a region in which a plurality of wirings are disposed side by side, said wiring pattern being formed through a plasma etching process of both said mask insulation film and said wiring metal film by using said resist film as a mask;
   a side-wall insulation film formation step for forming a side-wall insulation film on a side wall of each of said wirings;
   a trench formation step for forming a trench which has its bottom surface formed at a position lower than a lower surface of each of said wirings, said trench being disposed between adjacent ones of said wirings; and
   a void-containing insulation film formation step for forming an insulation film containing a void space portion therein, wherein said insulation film is formed in a manner such that said void space portion has its lower surface made substantially flush with said lower surface of each of said wirings.

3. The method of manufacturing the semiconductor device, according to claim 2, wherein a metal film made of aluminum-base alloys or of copper-base alloys is used as said wiring metal film in said resist-film formation step.

4. The method of manufacturing the semiconductor device, according to claim 2, wherein, in said resist-film formation step: a silicon oxide film or a silicon nitride film is used as said mask insulation film when a metal film made of aluminum-base alloys is used as said wiring metal film; and, a silicon nitride film is used as said mask insulation film when a metal film made of copper-base alloys is used as said wiring metal film.

5. The method of manufacturing the semiconductor device, according to claim 2, wherein, in said side-wall insulation film formation step: a silicon oxide film or a silicon nitride film is used as said side-wall insulation film when a metal film made of aluminum-base alloys is used as said wiring metal film; and, a silicon nitride film is used as said side-wall insulation film when a metal film made of copper-base alloys is used as said wiring metal film.

6. The method of manufacturing the semiconductor device, according to claim 2, wherein, in said resist-film formation step, as said wiring metal film comprising a lower layer and an upper layer, there are subsequently formed: said lower layer constructed of a high-melting metal film or a stacked film constructed of both said high-melting metal film and a nitride film of said high-melting metal film; and, said upper layer constructed of a metal film made of aluminum-base alloys or of copper-base alloys.

7. The method of manufacturing the semiconductor device, according to claim 2, wherein, in said resist-film formation step, as said wiring metal film comprising a lower layer, an intermediate layer and an upper layer, there are subsequently formed: a lower layer constructed of a high-melting metal film or a stacked film constructed of both said high-melting metal film and a nitride film of said high-melting metal film; said intermediate layer constructed of a metal film made of aluminum-base alloys or of copper-base alloys; and, said upper layer constructed of a high-melting metal film or a stacked film constructed of said high-melting metal film and a nitride film of said high-melting metal film.

8. The method of manufacturing the semiconductor device, according to any one of claims 1 to 7, wherein, in said wiring formation step, said semiconductor substrate has its surface slightly over-etched.

9. A method of protecting semiconductor devices from electronic damage during a metal etching process, comprising:

depositing a first insulator on a semiconductor substrate, and removing selected portions to form a patterned insulating layer;

depositing a metal layer having a specified thickness on the patterned insulating layer;

forming a patterning layer on the metal layer;

plasma etching the metal layer for a time period specified to etch a thickness of the metal layer equal to the specified thickness plus a specified over etch;

removing the patterning layer from the metal layer, resulting in a patterned metal layer of metal lines;

depositing a specified thickness of a second insulator on the patterned metal layer;

removing the portions of the second insulator on the top of the patterned metal layer and between individual ones of the patterned metal layer lines, resulting in a sidewall layer of the second insulator on each individual one of the patterned metal layer lines;

etching the exposed portions of the first insulator layer for a specified time period to form trenches between each individual one of the patterned metal lines having a specified depth below the metal lines; and depositing a third insulator on the patterned metal layer.

10. The method of claim 9, wherein the third insulator has at least one void disposed between each individual one of the patterned metal lines.

11. The method of claim 10, wherein the voids substantially extend from the bottom to the top of the patterned metal lines.

12. The method of claim 9, wherein the metal patterning layer comprises a dielectric layer deposited on the metal layer, a patterned photoresist layer, and the dielectric layer is etched before the metal layer is etched.

13. The method of claim 12, wherein the dielectric layer is a silicon nitride layer.

14. The method of claim 9, wherein the metal layer is selected from aluminum based alloys and copper based alloys.

15. The method of claim 9, wherein the second dielectric is a silicon nitride layer.

* * * * *